United States Patent [19]

Mobley

[11] Patent Number: 5,663,915

[45] Date of Patent: Sep. 2, 1997

[54] AMPLIFIER AND METHOD FOR SENSING HAVING A PRE-BIAS OR COUPLING STEP

[75] Inventor: Kenneth J. Mobley, Colorado Springs, Colo.

[73] Assignees: United Memories, Inc., Colorado Springs, Colo.; Nippon Steel Semiconductor Corporation, Japan

[21] Appl. No.: 483,279

[22] Filed: Jun. 7, 1995

[51] Int. Cl.[6] .................................................. G11C 7/00
[52] U.S. Cl. ........................ 365/208; 365/205; 365/207; 327/53; 327/54; 327/56
[58] Field of Search ............................... 327/53, 52, 54, 327/57; 365/207, 208, 205, 189.09

[56] References Cited

U.S. PATENT DOCUMENTS

| | | | |
|---|---|---|---|
| 4,553,053 | 11/1985 | Ong et al. ................................... | 365/208 |
| 4,766,333 | 8/1988 | Mobley ...................................... | 327/54 |
| 5,280,205 | 1/1994 | Green et al. ............................... | 307/530 |
| 5,325,001 | 6/1994 | Brunolli ..................................... | 327/54 |
| 5,544,114 | 8/1996 | Gaultier et al. ........................... | 327/54 |

*Primary Examiner*—David C. Nelms
*Assistant Examiner*—Vu A. Le
*Attorney, Agent, or Firm*—Edward D. Manzo; Mark J. Murphy; Ted K. Ringsred

[57] ABSTRACT

An improved current sensing differential amplifier which includes a separate p-channel bias stage to reduce the minimum operating voltage VCC of the circuit. The separate p-channel bias stage is also used to pre-bias a driver stage to more quickly generate differential output currents. Finally, the improved current sensing differential amplifier also includes negative feedback transistors to improve the recovery time of the circuit.

13 Claims, 3 Drawing Sheets

AMPLIFIER AND METHOD FOR SENSING HAVING A PRE-BIAS OR COUPLING STEP

FIELD OF THE INVENTION

This invention relates to a differential amplifier and more particularly to an improved current sensing differential amplifier.

DESCRIPTION OF THE PRIOR ART

Semiconductor memories generally include an orthogonal array of memory cells for storing binary data in the form of ones and zeros. The array typically includes columns of bit lines, often grouped in complementary pairs, and rows of word lines. A memory cell is located at each intersection of a bit line pair and a word line. A pair of bit lines can be selectively coupled to data lines under the control of one of a number of column select lines which originate from a column address decoder. Each of the word lines which originate from a row address decoder can selectively couple the memory cells in that row to their corresponding bit lines by turning on access transistors in the memory cell. Input addresses are decoded by the column address decoders and row address decoders to couple a particular memory cell, i.e. the memory cell located at the intersection of the selected bit lines and word lines, to the data lines. In this manner, binary data stored in the memory cells may be transferred to the bit lines and then to the data lines for eventual transfer to a memory output device. Data is written into the memory cells in the same general manner. A good description of illustrative static RAM circuitry is provided in U.S. Pat. No. 4,355,377 owned by Inmos Corporation and entitled "Asynchronously Equilibrated And Pre-Charged Static RAM."

The data signal that is read out of a memory cell, whether of the type described supra or not, via the bit lines requires amplification before it can be used to drive the memory output device. This amplification is usually achieved in a number of stages, and the amplifiers used for this purpose are called sense amplifiers. Conventional sense amplifiers have sensed a voltage differential between the bit lines. One problem with sensing the voltage differential between the bit lines is that the bit lines and data lines are capacitively loaded. Accordingly, the generation of the required voltage differential involves a time delay. The time delay caused by the capacitance necessarily increases the time required to read data from a memory cell.

Another problem associated with existing voltage sensing techniques is that the voltage differential remaining on the bit line from a prior operation (reading or writing) may have to be reversed for the correct operation. For example, if one bit line is 0.5 volts below its companion bit line after data has been read from a first memory cell, the bit lines, upon reading the data from a second memory cell, may have to change so the first bit line is now 0.5 volts above its companion bit line. In order to increase the speed of the memory circuit, techniques have been developed to "equilibrate" or short together the bit lines so that the voltage differential remaining on the bit lines from a prior operation is eliminated. For example, U.S. Pat. No. 4,355,377 describes address transition detection circuitry coupled to a clock generator driving precharge and equilibration circuits. One disadvantage of these techniques is that the circuit is very sensitive to the timing of the signals used to control the equilibrating operation.

Further disadvantages of using sensing techniques which depend on the voltage differential between the bit lines are the difficulty in obtaining optimal signal gain from the sense amplifiers and in shifting the common mode voltage level on the bit lines before the differential signal can be used as a memory output signal. Both of these problems are caused by the fact that in many applications the bit lines must be maintained above a voltage equal to about 80% of the device supply voltage to preserve memory cell stability.

To overcome the above-mentioned problems, I invented the Current Sensing Differential Amplifier described in my U.S. Pat. 4,766,333 which is incorporated by reference herein. FIG. 1 of the present invention is based upon FIG. 1 of the U.S. Pat. 4,766,333 and is directed to a simplified sense amplifier. It will be understood that while n-channel MOS transistors of the enhancement type are generally referred to in FIG. 1, other types of transistors could be substituted. Amplifier 10 includes a reference voltage circuit 11 and a first input terminal 12 and a second input terminal 14. The remaining portion of the circuit generally acts as a voltage amplifier. Input terminals 12 and 14 are coupled to ground (a reference voltage) through impedances 16 and 18, respectively. Input terminal 12 is coupled to the sources of n-channel transistors 22 and 24. Input terminal 14 is coupled to the sources of n-channel transistors 26 and 28. The gates of transistors 22, 24, 26, and 28 and the drains of transistors 24 and 26 are connected to a common node 30. Node 30 is coupled to a supply voltage VCC through a load 32. The drain of transistor 22 is coupled to VCC through a load transistor 34 and to a first output terminal 38. Likewise, the drain of transistor 28 is coupled to VCC through a load transistor 36 and to a second output terminal 40. Transistors 22 and 28 may be referred to as "primary input transistors" for amplifier 10. Transistors 24 and 26 may be referred to as "secondary input transistors."

The relative sizes of transistors 22 to 28 and loads 32 to 36 are important to the operation of the circuit 10. In general, primary input transistors 22 and 28 are kept in saturation so that the current through them is essentially independent of the drain to source voltage. They are electrically identical and are large compared to secondary input transistors 24 and 26 so that the majority of the current drawn through impedances 16 and 18 is supplied by transistors 22 and 28. When impedances 16 and 18 become unequal in value preferably through accessing a memory cell or writing data, different currents will pass through input nodes 12 and 14. Transistors 22 and 28 are large enough in size to ensure that the voltage differential developed at the input nodes 12 and 14, due to the differential input current, will be minimal over the entire range of differential current expected on input nodes 12 and 14.

The differing currents drawn through the source-drain paths of transistors 22 and 28 will cause a voltage differential to develop on output nodes 38 and 40. For a given current differential, the voltage differential is determined by the size of the transistors 34 and 36 and the size of transistors 22 and 28 relative to transistors 24 and 26. Transistors 34 and 36 are electrically symmetrical and are sized along with transistors 22 to 28 to allow the maximum voltage differential on output nodes 38 and 40 without allowing transistors 22 and 28 to drop out of the saturation region (which would occur if the voltage on output node 38 and 40 were allowed to drop more than an n-channel threshold voltage below the voltage on node 30) under the maximum current differential expected at inputs 12 and 14.

Secondary input transistors 24 and 26 are electrically identical and are sized along with load 32 such that node 30 is biased approximately one n-channel threshold voltage (1 $Vt_n$) above the desired common-mode voltage on input nodes 12 and 14 over the entire range of common-mode currents expected on the input nodes. The common-mode input voltage can be adjusted by varying the size of load 32. Further, transistors 24 and 26 are sized along with load 32 such that the bias point of node 30 will recover at an adequate rate after a sudden change in input currents to ensure that circuit 10 will operate properly under non-equilibrium voltage conditions on input nodes 12 and 14.

When input nodes 12 and 14 are coupled to ground through impedances 16 and 18, current is drawn through primary and secondary input transistors 22 to 28. This current causes common node 30 and output nodes 38 and 40 to drop in voltage by an amount determined by their respective loads 32, 34, and 36. Because transistors 22 and 28 remain in the saturation region due to the appropriate sizing of transistors 22 and 28 relative to 24 and 26, and transistors 34 and 36 relative to load 32, the voltage on output nodes 38 and 40 will have little effect on the voltage on input nodes 12 and 14. Thus, the voltage on the input nodes 12 and 14 will be determined by the currents into the inputs 12 and 14, the sizes of transistors 22 and 28, and the voltage on node 30. If transistors 22 and 28 are large, the voltage on nodes 12 and 14 will be very nearly equal to the voltage on node 30 minus the threshold voltage of transistors 22 and 28. Thus, the differential input voltage will be minimized.

In operation, sense amplifier 10 produces a differential voltage on output nodes 38 and 40 in proportion to or in accordance with differential input current at input nodes 12 and 14. In FIG. 1, the differential input current is provided when impedances 16 and 18 become unequal in value. As set forth in my U.S. Pat. 4,766,333, when the circuit of FIG. 1 is used as a pre-sense amplifier, the differential input current is supplied via bit lines. When the circuit of FIG. 1 is used as a main sense amplifier, the differential input current is supplied by data read lines.

If impedance 16 is decreased relative to impedance 18, for example, the current drawn through the source-drain paths of transistors 22 and 24 will increase, and the voltage at input node 12 will drop in an amount necessary to supply the extra current. However, such voltage drop will be small because transistor 22 is preferably a large device. The extra current flowing through transistor 22 will result in a voltage drop on output node 38 due to the presence of transistor 34. Thus, a voltage differential is developed on output nodes 38 and 40 due to the application of the differential input current at input nodes 12 and 14. As mentioned earlier, transistors 34 and 36 are sized along with transistors 22 to 28 to allow the maximum voltage differential on output nodes 38 and 40 without allowing transistors 22 and 28 to drop out of the saturation region.

Furthermore, as the current through secondary input transistor 24 increases, the voltage on common node 30 will decrease. This decreases the voltage on the gates of transistors 26 and 28 and hence will cause the voltage at the sources of these transistors (i.e. at node 14) to decrease. Thus, a decrease in voltage on input node 12 will be mimicked by a decrease in voltage on node 30 and subsequently by a decrease in voltage on input node 14. In particular, because node 30 is coupled to the gates of transistors 26 and 28, the current through node 14 is reduced. In this manner, the long term voltage differential developed between the input nodes 12 and 14 is further minimized. The time required for node 30 to recover to its normal bias point is a function of how much of the total current flowing out input nodes 12 and 14 is allowed to pass through secondary input transistors 24 and 26. This is determined by the ratio of the size of transistors 22 and 28 to the size of transistors 24 and 26.

Because primary input transistors 22 and 28 are large compared to secondary input transistors 24 and 26, most of the current flowing through nodes 12 and 14 is supplied by transistors 22 and 28 and consequently by transistors 34 and 36 (assuming negligible current is supplied through the outputs 38 and 40). Thus, the differential voltage on output nodes 38 and 40 will reflect the differential current on input nodes 12 and 14 in a manner determined by loads 34 and 36. Since the voltage on the input nodes continues to be determined by the voltage on node 30, the output voltages will not affect the input voltages, and the voltage differential on the input nodes will remain small. Because there is a finite delay between the time when the input current changes and the time when node 30 and subsequently the opposite input node voltage become adjusted to equilibrium levels, the differential current through transistors 22 and 28 is amplified for the initial period of the output transition, thereby speeding up the response time of the sensing circuit to a change in the differential current into the input nodes. Furthermore, because only small voltage differences are developed on the input nodes 12 and 14, the period of time required for the input voltages to adjust themselves to the proper voltage state (after a sudden change in differential input current signal states) is small for a given capacitance on input nodes 12 and 14.

Turning to FIG. 2, a further (prior art) improvement to the current sense amplifier is shown. In particular, p-channel transistors 42 and 44 are added in series with transistors 24 and 26, respectively, to form a separate left node 46 and a separate right node 48 to replace common node 30. The drains of transistors 42 and 24 are coupled to their respective control electrodes at the left node 46. Left node 46 is coupled to the control electrodes of transistors 28 and 36 to control the current flow through impedance 18. The drains of transistors 44 and 26 are connected to their respective control electrodes at right node 48. Right node 48 is coupled to the control electrodes of transistors 22 and 34 to control the current through impedance 16.

As shown in FIG. 2, the improved current sense amplifier minimizes the differential voltage on inputs 12 and 14. In particular, if impedance 16 is decreased relative to impedance 18, the current flowing through the source-drain paths of primary input transistors 22 and secondary input transistor 24 will increase. As stated earlier, the voltage at left node 12 will decrease to supply the extra current, causing a decrease in the voltage at node 46. Because left node 46 is coupled to the control electrode of transistor 28, transistor 28 will turn on softer to lower the voltage at node 14 to minimize the differential voltage on inputs 12 and 14. As is apparent, by forming separate left and right nodes, a change in the impedance (and therefore the current) in one input (12 or 14) will alter the voltage at the other input node.

It will be noted that the respective left and right nodes are not connected to the primary transistor on the same side of the circuit. That is, node 46 is not connected to primary transistor 22 and node 48 is not connected to primary transistor 28. Therefore, a change in impedance 16 will not alter the voltage at the control electrode (gate) of primary transistor 22 and will not further affect the voltage at node 12. Similarly, right node 48 is not coupled to the control electrode of primary transistor 28. Therefore, a change in impedance 18 will not alter the voltage at the control electrode of primary transistor 28 and will not further affect the voltage at node 14. Accordingly, the differential input voltage at input 12 and 14 is minimized.

An object of the present invention is to provide an improved current sense amplifier having negative feedback to improve the response time of the circuit.

A further object of the invention is to provide an improved current sense amplifier that can operate at a lower supply voltage.

Another object of the improved current sense amplifier is to provide a bias stage which can be used to pre-bias a driver stage to more quickly generate differential output voltages.

SUMMARY OF THE INVENTION

The present invention is directed to an improved current sense amplifier for detecting a change in differential currents in semiconductor memory devices. The improved current sense amplifier includes feedback transistors which provide negative feedback after the switching has occurred, and positive feedback during the switching. Accordingly, the circuit responds quickly to a change in input currents, but limits the switching. That is, the negative feedback limits the differential input voltages and enables the differential output to be restored to the original state more quickly.

The circuit also includes an additional stage to generate separate p-channel bias voltages for left and right sides of the circuit. The separate p-channel bias stage allows the differential amplifier to operate at a lower Vcc. Also, the separate bias stages can be used to pre-bias a driver to more quickly generate differential output voltages.

BRIEF DESCRIPTION OF THE DRAWINGS

In describing the present invention, reference is made to the following drawings wherein.

DESCRIPTION OF THE PREFERRED EMBODIMENTS

Figure 3:
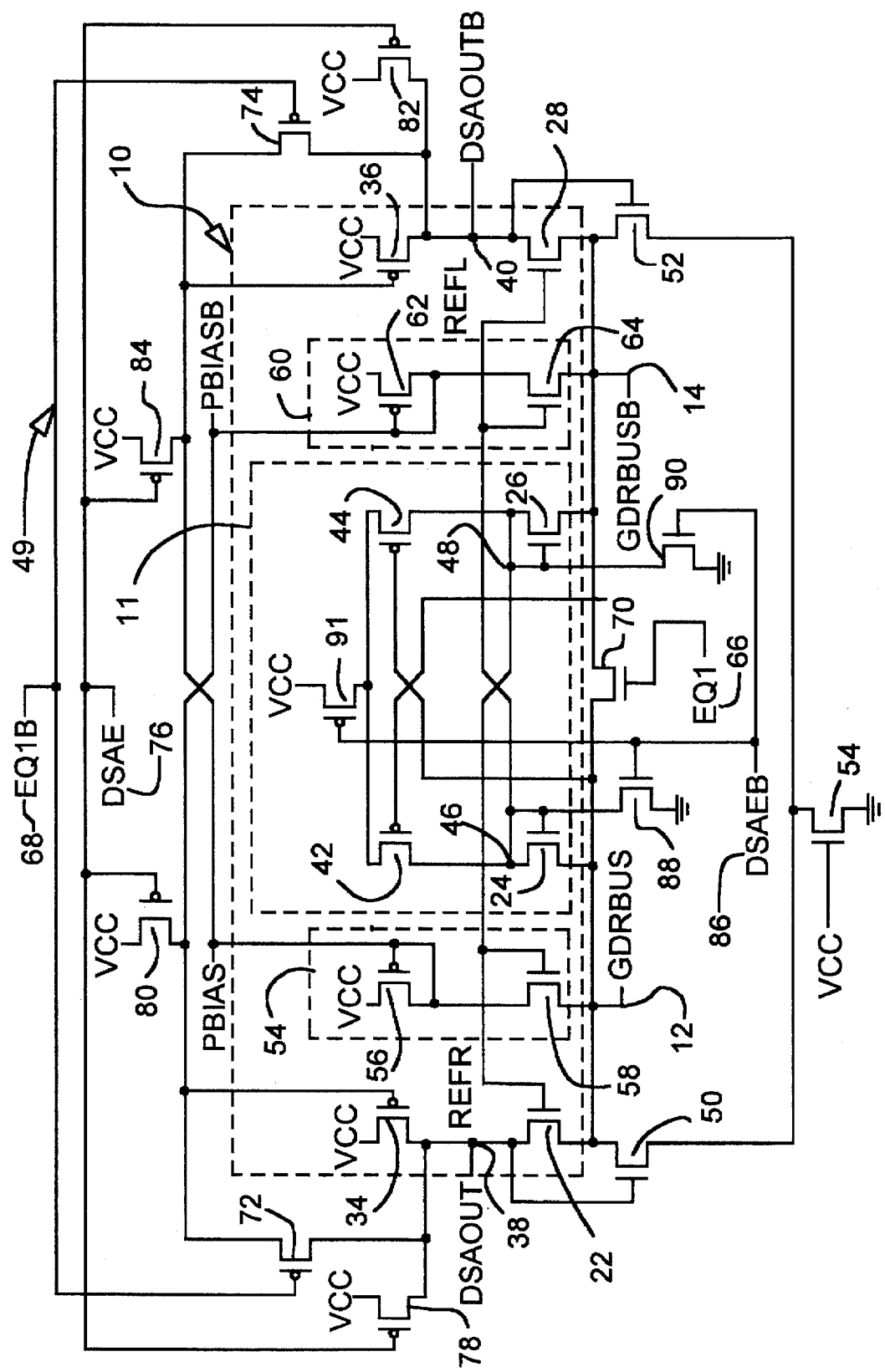
FIG. 3 is an improved current sense amplifier employed in the present invention.

Turning now to FIG. 3, a preferred embodiment of an improved current sense amplifier 49 according to the present invention is shown. Current sense amplifier 49: (i) includes bias transistors to provide negative feedback to improve the recovery time of a current sense amplifier by adjusting the bias current; (ii) decreases the minimum operating voltage of the circuit; and (iii) provides a pre-bias voltage for a driver circuit coupled to the differential amplifier circuit to provide differential output currents more quickly.

Figure 1:
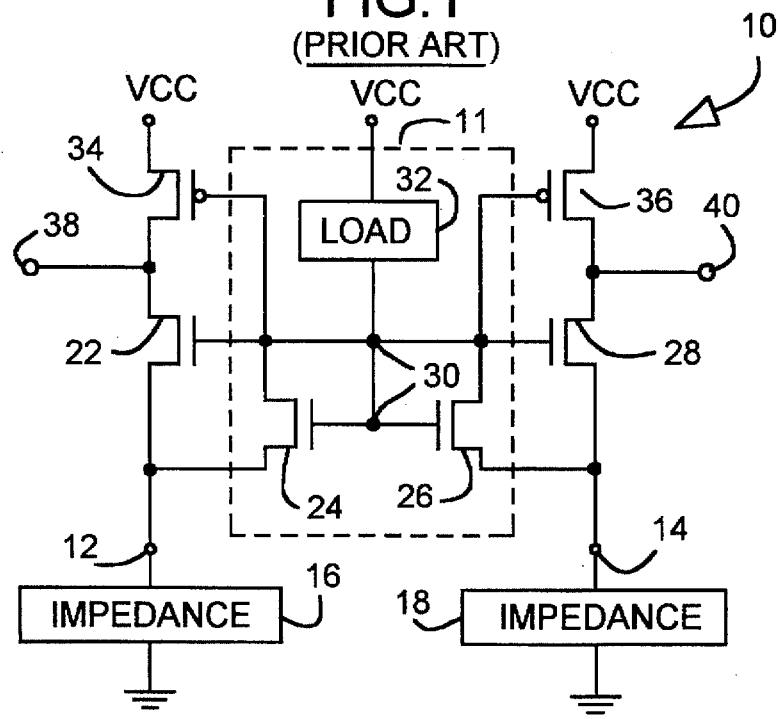
FIG. 1 is a circuit diagram of a current sense amplifier in the prior art.
Figure 2:
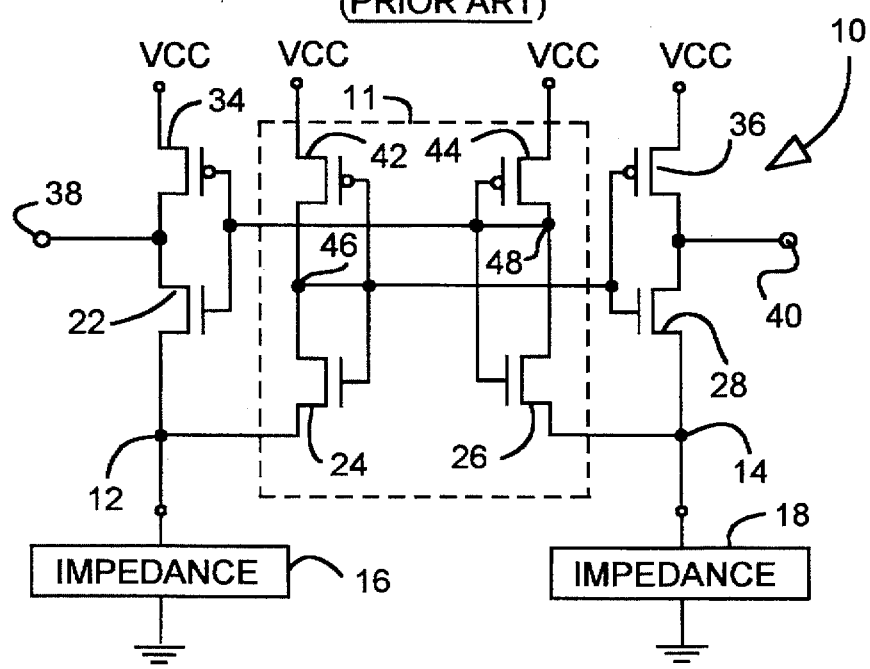
FIG. 2 is an improved current sense amplifier known in the prior art based upon the circuit of FIG. 1.

The circuit of FIG. 3 is based upon FIG. 2 and numbers for like components shown in FIG. 2 are provided in FIG. 3. Generally, the circuit has been modified to include negative feedback transistors 50 and 52 which also provide the bias current. The circuit also includes an additional stage comprising circuits 54 and 60 on the left and right sides of the circuit, respectively. Circuits 54 and 60 allow the minimum operating voltage of the circuit to be reduced. Finally, the reference voltage circuit 11 of FIG. 3 has been modified. Circuit 11 of FIG. 3 is similar to circuit 11 of FIG. 2. However, the control electrode of transistors 42 and 44 are no longer coupled to the respective left and right nodes 46 and 48 as in the prior art circuit of FIG. 2. Rather, the control electrode of transistor 42 is coupled to input node 14 and control electrode of transistor 44 is coupled to input node 12.

Describing now the specific improvements in detail, a first improvement in the circuit of FIG. 3 is the addition of feedback transistors 50 and 52. Transistors 50 and 52 provide the bias current in the circuit. Transistor 50 provides a bias current and negative DC feedback for the left half of the circuit, and transistor 52 provides a bias current and negative DC feedback for the right side of the circuit. In particular, the drain of transistor 50 is coupled to the source of transistor 22. The source of transistor 50 is coupled to the drain of a transistor 54, the source-drain path of which provides a path to ground. The control electrode of transistor 50 is coupled to the output node 38. Similarly, the drain of transistor 52 is coupled to the source of transistor 28 on the right side of the circuit. The source of transistor 52 is also coupled to the drain of transistor 54 which provides a path to ground. The control electrode of transistor 52 is coupled to output node 40. The operation of the feedback transistors will be described in detail infra.

A second improvement in the circuit can be seen in a left p-channel bias stage 54 including a p-channel transistor 56 and an n-channel transistor 58, and a right p-channel bias circuit 60 including a p-channel transistor 62 and an n-channel transistor 64. Circuits 54 and 60 provide a separate stage for the left and right sides of the circuit, respectively, to generate separate p-channel bias signals. Therefore, in addition to reference voltage circuit 11 generating separate left and right reference voltages (i.e. n-channel bias voltages) at nodes 46 and 48, respectively, the improved circuit of the present invention also generates separate p-channel bias signals. The p-channel bias signals are coupled to the driver stage shown in FIG. 4 to pre-bias the driver stage.

On the left side of the circuit of FIG. 3, transistors 56 and 58 are coupled in series between VCC and input node 12. The source of p-channel transistor 56 is coupled to VCC. The control electrode of transistor 56 is coupled to its drain, both of which are coupled to the drain of n-channel transistor 58. The source of transistor 58 is coupled to input node 12. The control electrode of transistor 58 is coupled to right node 48. The control electrode and drain of transistor 56 are coupled to an output terminal PBIAS.

Similarly, on the right side of the circuit, transistors 62 and 64 are coupled in series between VCC and input 14 to generate a separate p-channel bias signal PBIASB. The source of transistor 62 is coupled to VCC. The control electrode of p-channel transistor 62 is coupled to its drain and to the drain of n-channel transistor 64. The source of transistor 64 is coupled to input node 14. Finally, the control electrode of transistor 64 is coupled to left node 46. As will be described in detail in reference to FIG. 4, PBIAS and PBIASB are coupled to the driver stage of FIG. 4 to provide differential load currents. The generation and function of the PBIAS and PBIASB signals will be described in detail infra.

Operation

The operation of the improved current sense amplifier 49 will now be described in detail. Because the circuit is symmetrical, the operation of the circuit based on a change in the input current at one node (for example, node 12) will be described in detail. The operation of the circuit based upon change in the input current at the other node (node 14) will be understood in view of the following description. When the voltage at node 12 drops (with the increase in current at node 12), transistors 22, 24 and 58 will turn on harder. These transistors will help generate differential output voltages at nodes 38 and 40 more quickly.

In particular, with the drop in voltage at node 12, the gate to source voltage increases and transistor 58 will turn on harder. The same action occurs with respect to transistors 22 and 24 because node 12 is connected to the sources thereof. As transistor 22 turns on harder, it couples more firmly the dropping voltage of node 12 to node 38. Hence, the voltage signal DSAOUT at output 38 will begin to drop. Similarly, as transistor 24 turns on harder, its drain voltage will drop. Because the drain of transistor 24 (node 46) is coupled to the gate of n-channel transistor 64, transistor 64 will begin to turn off, allowing the voltage at the drain of transistor 64 (PBIASB) to rise, on account of the source-drain path to VCC at transistor 62.

PBIASB is coupled to the gate of p-channel transistor 34. When PBIASB rises, it will begin to turn off p-channel transistor 34 to decouple VCC from DSAOUT at output node 38, thereby allowing node 38 to be pulled lower by transistor 22.

Finally, as the voltage at input node 12 drops, the voltage at the drain of transistor 58 (PBIAS) will also drop. This is because transistor 58 turns on harder as the gate to source voltage increases. Hence, PBIAS begins to be pulled lower. PBIAS is coupled to the gate of p-channel transistor 36. As PBIAS drops, transistor 36 will begin to turn on and will pull up the voltage DSAOUTB at node 40. Accordingly, stages 54 and 60 work to generate a differential voltage between DSAOUT and DSAOUTB quickly.

In addition, stages 54 and 60: (i) provide separate p-channel bias signals to "pre-bias" the driver stage (described in detail infra in reference to FIG. 4); and (ii) lower the minimum voltage VCC under which the circuit can operate. Referring to FIG. 2 showing the prior art differential amplifier, VCC must be maintained at a certain voltage in order to drive current through transistors 42 and 24 on the left side (or transistors 44 and 26 on the right side). In particular, it is desirable to maintain the voltage at input node 12 at least 0.5 volts above ground (and preferably 1.0 volt above ground) when operating the differential amplifier. In order to drive current through transistor 24, node 46 must be at least one threshold voltage $V_T$ (at least 0.7 volts but preferably 1.25 volts) above the voltage at node 12. Similarly, to drive current through transistor 42, VCC must be approximately one threshold voltage $V_T$ above node 46. Therefore, VCC must be at least two threshold voltages (2 $V_T$) above the voltage at input node 12.

However, by adding stages 54 and 60 shown in FIG. 3, the minimum VCC in the circuit can be reduced. In particular, because the control electrode of transistor 42 is no longer coupled to node 46, the voltage at node 46 is not restricted to one threshold voltage below VCC, as is required in the prior art circuit of FIG. 2. Rather, node 46 (and Vcc) need only be one threshold voltage above the voltage at input 12. Similarly, the drain of transistor 58 need not be one threshold voltage above the voltage at node 12. Rather, the voltage at the drain of transistor 58 need only be a threshold voltage below VCC. Accordingly, the minimum VCC can be approximately one threshold voltage $V_T$ lower than the minimum VCC of the prior art shown in FIG. 2.

Having described the operation of the stages 54 and 60 to lower the operating voltage VCC and generate differential output voltages, the operation of feedback transistors 50 and 52 to improve recovery time after the output voltages DSAOUT and DSAOUTB begin to switch and also provide negative feedback after the switching has occurred will be described. When the current sense amplifier is performing in a steady state mode, transistors 50 and 52 are providing negative feedback to limit the differential output voltages. In particular, when the voltage at DSAOUT begins to increase, transistor 50 begins to turn on harder to pull node 12 low, thus lowering the voltage at input node 12. As was previously discussed, the dropping voltage at node 12 is coupled to node 38, hence, the voltage signal at node 38 will begin to drop and will pull the voltage at DSAOUT back down to its steady state value. As the voltage at DSAOUT begins to decrease, transistor 50 begins to turn on softer to pull node 12 high, thus increasing the voltage at input node 12. Consequently, the increasing voltage at node 12 will cause the voltage signal at node 38 to increase and will pull the voltage at DSAOUT back up to its steady state value. Similarly, feedback transistor 52 adjusts the voltage at input node 14 in relation to fluctuations in DSAOUTB. Thus, transistors 50 and 52, by providing negative feedback, minimize the voltage differential of the outputs DSAOUT and DSAOUTB in steady state operation.

Transistors 50 and 52 also provide positive feedback during switching. In particular, when the voltage at node 12 begins to drop (with the increase in current at node 12) transistor 50 is pulled low. Since the gate voltage of transistor 50 remains the same due to a delay between the input and output, the current drawn through transistor 50 is decreased. As the voltage drop at node 12 reaches the output node 38, transistor 50 will turn on softer and will further pull node 12 low to increase the switching response at output node 38. Similarly, as the voltage at node 14 increases (with a decrease in the current at node 14) transistor 52 is pulled high. Since the gate voltage of transistor 52 remains the same due to a delay between the input and output, the current drawn through transistor 52 is increased. As the voltage increase at node 14 reaches the output node 40, transistor 52 will turn on harder and will further pull node 14 high to increase the switching response at output node 40.

Finally, the circuit of FIG. 3 includes additional transistors which are used to restore nodes to equilibrium values after the outputs have switched and to place nodes in a desired state at power up. In particular, the improved current sense amplifier of FIG. 3 includes a first equilibrium input 66 to receive a signal EQ1 and a second equilibrium input 68 to receive a second equilibrium signal EQ1B. Equilibrium transistors are used to couple nodes to a particular reference potential or to one another to maintain equilibrium in the circuit. The equilibrium transistors are used to eliminate any gain of the amplifier until the circuit reaches a DC operating state. EQ1 is coupled by way of equilibrium input 66 to an n-channel transistor 70 which is used to maintain the equilibrium voltage at nodes 12 and 14. The equilibrium input 68 is coupled to p-channel transistors 72 and 74 to maintain an equilibrium voltage at the outputs 38 and 40.

During power up, EQ1 is pulled high and EQ1B is pulled low. A high EQ1 signal will turn on transistor 70 to equalize the voltages at GDRBUS and GDRBUSB and, therefore, the PBIAS and PBIASB voltages. Similarly, a low EQ1B turns on transistors 72 and 74 to tie the output voltages DSAOUT and DSAOUTB at nodes 38 and 40, respectively, to PBIASB and PBIAS, respectively. After power up, EQ1 is pulled low and EQ1B is pulled high. Transistors 70, 72 and 74 are off and do not effect the voltages in the circuit. Accordingly, the differential output voltage DSAOUT and DSAOUTB at output nodes 38 and 40 are minimized.

Finally, the circuit of FIG. 3 includes an input 76 to receive an input signal DSAE which is coupled to p-channel transistors 78 and 80 to initialize the voltage at node 38 and p-channel transistors 82 and 84 to initialize the voltage at node 40 during a power down state. Finally, the improved current sensing amplifier includes an input 86 to receive DSAEB which is coupled to transistors 88, 90, and 91 to reset the voltages at left and right nodes 46 and 48. As will be described in detail in reference to the driver stage of FIG. 4, it is often beneficial to latch the output and turn off the amplifier of FIG. 3 to conserve power. During power down, DSAEB is pulled high to turn off transistor 91 and turn on transistors 88 and 90. Transistors 88 and 90 will pull nodes 46 and 48 low to ignore any changes at inputs 12 and 14. Also, DSAE is pulled low to turn on transistors 78, 80, 82 and 84 to tie output voltages DSAOUT and DSAOUTB at nodes 38 and 40 high.

Figure 4:
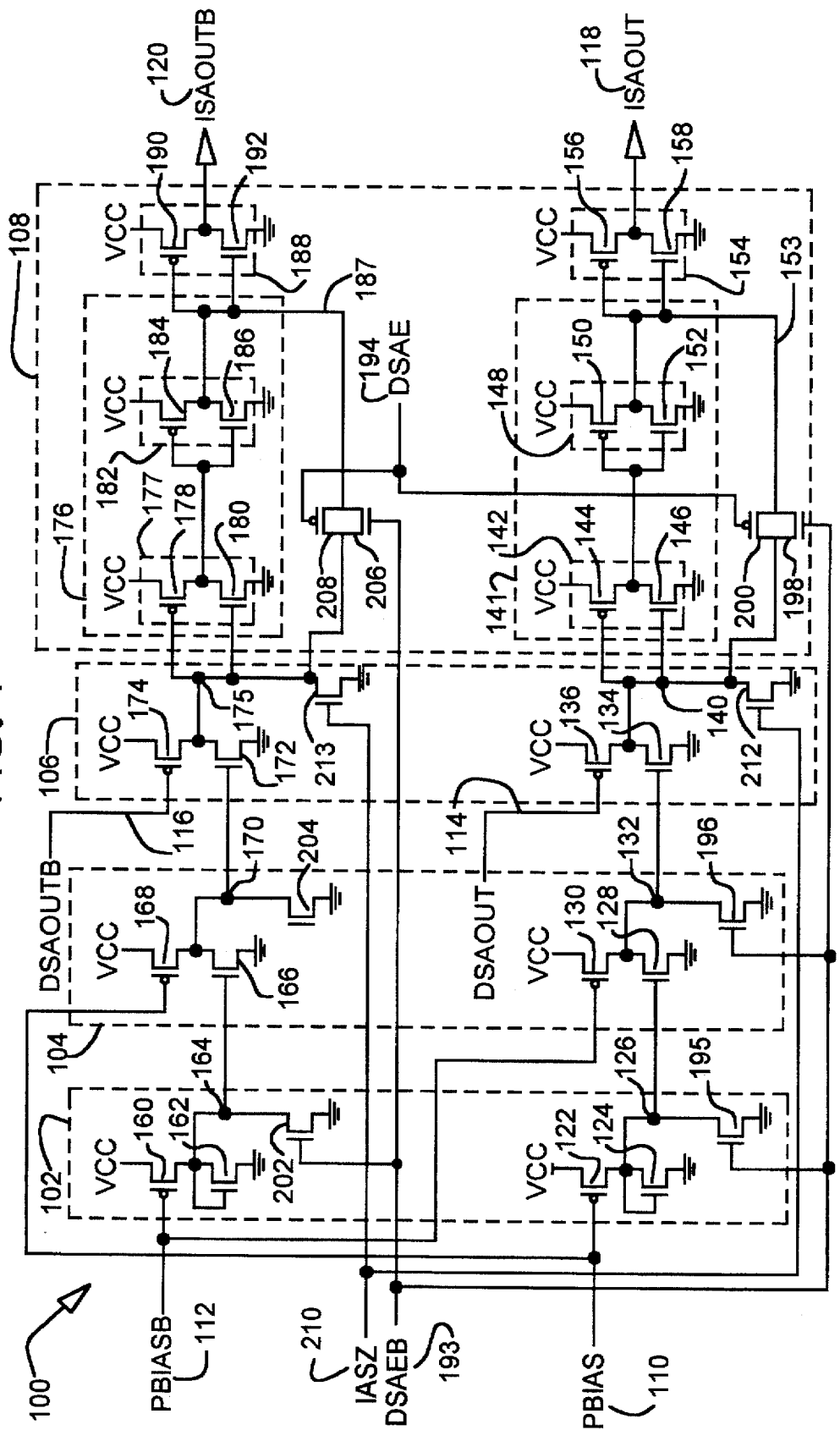
FIG. 4 is a driver stage for use with the amplifier shown FIG. 3.

Turning now to FIG. 4, a driver stage 100 adapted to receive the differential output voltages DSAOUT and DSAOUTB and the pre-bias signals PBIAS and PBIASB from the differential amplifier of FIG. 3 is shown. The driver circuit 100 comprises a first pre-bias stage 102, a second pre-bias stage 104, a driver stage 106 and a latch stage 108. Driver circuit 100 receives the PBIAS signal at an input 110 and the PBIASB signal at an input 112. Driver stage 100 also receives DSAOUT at an input 114 and DSAOUTB at an input 116. Driver circuit 100 uses these differential output voltages to generate differential current outputs ISAOUT and ISAOUTB at output terminals 118 and 120, respectively of FIG. 4. Generally, the lower part of the circuit generates ISAOUT and the upper part of the circuit generates ISAOUTB.

As described supra, DSAOUT and DSAOUTB tend to be driven towards opposite reference potentials. That is, when DSAOUT approaches VCC, DSAOUTB approaches ground, and vice versa. PBIAS and PBIASB follow DSAOUT and DSAOUTB, respectively, and also tend to approach opposite reference voltages. The PBIAS signal at input 110 is coupled to the control electrode of a transistor 122. The source/drain path of transistor 122 is coupled between VCC and a transistor 124 which is configured as a resistor (i.e. the gate is coupled to the drain). An output of the first pre-bias stage is generated at node 126 (between the series of transistors 122 and 124).

Node 126 is coupled to the control electrode of a transistor 128 of the second pre-bias stage. A second transistor 130 is coupled in series between transistor 128 and VCC. The control electrode of transistor 130 is coupled to receive PBIASB. A node 132 at the drains of transistors 128 and 130 is an output of the second pre-bias stage 104. Node 132 is coupled to a control electrode of a transistor 134 of driver stage 106. A second transistor 136 is coupled in series between transistor 134 and VCC. The control electrode of transistor 136 is coupled to receive the DSAOUT signal at input 114. Finally, the driver stage generates an output at node 140. Node 140 is coupled to latch circuit 108.

Latch circuit 108 includes a latch 141, which includes an inverter 142, comprising a series of transistors 144 and 146, and an inverter 148, comprising transistors 150 and 152, and an inverter 154, comprising transistors 156 and 158. A feedback path 153 for the latch is provided. The output of inverter 154 is coupled to the output node 118 to generate a first output current ISAOUT.

Similarly, the upper half of the circuit generates the other current signal of the pair of differential output current signals. The PBIASB signal at input 112 is coupled to the control electrode of a transistor 160. The source/drain path of transistor 160 is coupled between VCC and a transistor 162 which is configured as a resistor (i.e. the gate is coupled to the drain). An output of the first pre-bias stage 102 is generated at node 164 (between the series of transistors 160 and 162).

Node 164 is coupled to the control electrode of a transistor 166 of the second pre-bias stage 104. A second transistor 168 is coupled in a series between transistor 166 and VCC. The control electrode of transistor 168 is coupled to receive PBIAS. A node 170 at the drains of transistors 166 and 168 is an output of the second pre-bias stage 104. Node 170 is coupled to a control electrode of a transistor 172 of driver stage 106. A second transistor 174 is coupled in series between transistor 172 and VCC. The control electrode of transistor 174 is coupled to receive the DSAOUTB signal at input 116. The driver stage generates an output at a node 175. Node 175 is coupled to latch circuit 108.

Latch circuit 108 includes a latch 176, which includes an inverter 177, comprising a series of transistors 178 and 180, and an inverter 182, comprising transistors 184 and 186, and an inverter 188, comprising transistors 190 and 192. A feedback path 187 for the latch is provided. The output of inverter 188 is coupled to the output node 120 to generate a second output current ISAOUTB.

The operation of the driver circuit 100 will now be described in detail. Assuming that the impedance at input 12 drops and the current at the input increases (as described in the operation of the amplifier of FIG. 3), the voltages at PBIAS and DSAOUT will drop, while the voltages at PBIASB and DSAOUTB will increase. As the voltage at PBIAS drops, transistor 122 turns on harder to pull up the voltage at node 126. Node 126 is coupled to the control electrode of transistor 128. Also, PBIASB is coupled to the control electrode of transistor 130. Because the voltage PBIASB is increasing, transistor 130 is turning off more. Therefore, the voltage at node 132 is being pulled down. This use of PBIAS and PBIASB functions to "pre-bias" driver stage 106. In particular, the low PBIAS and the high PBIASB generate a low voltage at node 132. Therefore, the low potential of DSAOUT turns on transistor 136 to pull up the output at node 140 to VCC even more quickly. Accordingly, the PBIAS and PBIASB signals help drive the potential at node 140 more quickly. Node 140 is coupled to the input of latch 141. The voltage at node 140 is passed through inverters 142 and 148. The output of latch 141 is coupled to an inverter 154 which is used to generate the output current ISAOUT at output node 118. The operation of the latch 141 will be described in detail infra.

The upper portion of the circuit also uses the pre-bias signals PBIAS and PBIASB to generate an output current ISAOUTB at output 120. In particular, PBIASB is coupled to the control electrode of transistor 160. Because PBIASB is high, transistor 160 begins to turn off and drive the potential at node 164 low. Node 164 is coupled to the control electrode of transistor 166. The low potential at node 164 turns off transistor 166. However, PBIAS, which is low, begins to turn on transistor 168 to drive the output node 170 high. Node 170 is coupled to the driver stage 106 at the control electrode of a transistor 172. Transistor 172 turns on to pull node 175 low. DSAOUTB is also high and therefore turns off transistor 174, further pulling node 175 low. Therefore, the pre-bias signals PBIAS and PBIASB help drive the voltage at node 175 to the same potential that transistor 174 (receiving DSAOUTB) is driving node 175. The voltage at node 175 is coupled to latch 176, which comprises inverters 177 and 182. The voltage at 175 is passed through inverters 177 and 182. The output of latch 176 is coupled to the input of inverter 188. Inverter 188 is used to generate the output current ISAOUTB at output node 120.

The latching feature of driver stage of FIG. 4 will now be described. The driver stage includes an input 193 to receive DSAEB and an input 194 to receive DSAE. The lower portion of the circuit includes a transistor 195 coupled to node 126 of the first pre-bias stage 102. The circuit also includes a transistor 196 which is coupled to node 132 of the second pre-bias stage 104. Finally, the lower portion of the circuit includes transistors 198 and 200 forming a gate in feedback path 153 of latch 141. The control electrodes of transistors 195, 196 and 198 are coupled to receive DSAEB and the control electrode transistor 200 is coupled to receive DSAE.

When the amplifier of FIG. 3 is operating and the outputs are not latched, DSAEB is low, turning off transistors 195, 196 and 198, while DSAE is high turning off transistor 200. Because transistors 195 and 196 are off, these transistors have no effect on nodes 126 and 132 respectively. Similarly, both transistors 198 and 200 are off, disabling latch 141. As a result, the voltage generated at node 140 is allowed to pass through inverters 142 and 148 to inverter 154. Accordingly, any change in the outputs of the differential amplifier will be reflected in the differential output currents ISAOUT and ISAOUTB.

However, to reduce power, it is often useful to disable the amplifier (FIG. 3) and latch the output of the driver stage (FIG. 4). Accordingly, DSAEB can be pulled high to turn on transistors 195, 196 and 198. As a result, the driver circuit 100 of FIG. 4 will ignore PBIAS and DSAOUT. Also, the gate comprising transistors 198 and 200 will open, closing feedback path 153 and allowing latch 141 to latch the output current at node 118.

The latching operation of the upper portion of the circuit is also provided by transistors 202, 204, 206 and 208. In particular, transistor 202 is coupled to node 164 of the first pre-bias stage 102. Transistor 204 is coupled to node 170 of the second pre-bias stage 104. Finally, transistor 206 and 208 form a gate in feedback path 187 of latch 176. When DSAEB is low and DSAE is high, transistors 202, 204, 206 and 208 are off, and therefore do not affect the circuit. However, when the amplifier is disabled to reduce power and the current ISAOUTB at output 120 is to be latched, DSAEB is pulled high and DSAE is pulled low. Accordingly, transistors 202, 204, 206 and 208 turn on. When transistor 202 turns on, node 164 is pulled to the ground. When transistor 204 is turned on, node 170 is pulled to ground. Finally, when transistors 206 and 208 are on, a feedback path 187 is provided in latch 176 to latch the current at output node 120.

Finally, the driver circuit of FIG. 4 includes an input 210 to receive a signal ISAZ. This signal is used to reset outputs 118 and 120. In particular, ISAZ is coupled to a transistor 212. When ISAZ is pulled high, the node 140 at the input of latch 141 is pulled low to maintain the current at output node 118. Similarly, the upper circuit includes a transistor 213. When ISAZ is pulled high, transistor 213 turns on to pull the potential at node 175 low to maintain the current at output node 120.

While this invention has been described with reference to an illustrative embodiment, it will be understood that this description is not intended to be construed in a limiting sense, but is intended to include any substitutes within the scope of the invention. Various modifications of the illustrative embodiment, as well as other embodiments, will become apparent to those skilled in the art upon reference to this description. The invention is intended to be set forth in the following claims.

I claim:

1. A method for sensing a state of a memory cell, said method comprising the steps of:
   developing differential currents at inputs of an amplifier based upon impedances related to the state of said memory cell;
   developing voltage transitions in said amplifier in accordance with said differential currents;
   controlling voltages during said developing steps at said inputs by negative feedback; and
   developing differential voltages at outputs based on said differential currents,
   wherein the step of developing differential voltages includes developing a first set of differential voltages to pre-bias an amplifier to amplify said differential voltages at said outputs.

2. The method according to claim 1, further comprising the steps of:
   sensing said differential voltages at said outputs to develop a further differential current; and
   amplifying said further differential current to provide further differential voltages.

3. A method for sensing a state of a memory cell, said method comprising the steps of:
   developing differential currents at inputs of an amplifier based upon impedances related to the state of said memory cell;
   developing voltage transitions in said amplifier in accordance with said differential currents;
   controlling voltages during said developing steps at said inputs by negative feedback; and
   developing differential voltages at outputs based on said differential currents,
   further comprising the steps of:
   coupling first and second transistors in respective first and second circuit paths between a reference voltage and a source of operating voltage; and
   maintaining said first and second transistors in saturation, wherein said inputs are coupled to a selected one of the sources and drains of said first and second transistors, and said differential voltages are developed at the other one of the sources and drains of said first and second transistors.

4. An amplifier for a semiconductor circuit comprising:
   first and second inputs;
   first and second outputs;
   first and second circuit paths each coupling a source of operating voltage to a reference voltage;
   wherein said first circuit path is coupled to said first input and said first output, said first circuit path including a first transistor and a second transistor, said first transistor having its source-drain path coupled between said first input and said first output, and said second transistor having its source-drain path coupled between said first input and ground and its control electrode coupled to said first output to provide negative feedback; and
   wherein said second circuit path is coupled to said second input and said second output, said second circuit path including a third transistor and a fourth transistor, said third transistor having its source-drain path coupled between said second input and said second output, and said fourth transistor having its source-drain path coupled between said second input and ground and its control electrode coupled to said second output to provide negative feedback,
   further including a first stage to generate first and second reference voltages, said first reference voltage being coupled to the control electrode of said first transistor and said second reference voltage being coupled to the control electrode of said third transistor.

5. The amplifier according to claim 4, wherein said first stage includes third and fourth circuit paths each including a transistor, said transistor of said third circuit path being coupled between said source of operating voltage and said second reference voltage and having its control electrode coupled to said second input, and said transistor of said fourth circuit path being coupled between said source of operating voltage and said first reference voltage and having its control electrode coupled to said first input.

6. An amplifier for a semiconductor circuit comprising:

first and second inputs;

first and second outputs;

first and second circuit paths each coupling a source of operating voltage to a reference voltage;

wherein said first circuit path is coupled to said first input and said first output, said first circuit path including a first transistor and a second transistor, said first transistor having its source-drain path coupled between said first input and said first output, and said second transistor having its source-drain path coupled between said first input and ground and its control electrode coupled to said first output to provide negative feedback; and wherein said second circuit path is coupled to said second input and said second output, said second circuit path including a third transistor and a fourth transistor, said third transistor having its source-drain path coupled between said second input and said second output, and said fourth transistor having its source-drain path coupled between said second input and ground and its control electrode coupled to said second output to provide negative feedback, further including a second stage having third and fourth outputs, said third and fourth outputs adapted to be coupled to a driver circuit to generate differential output currents.

7. The amplifier according to claim 6, further including a driver circuit including a pre-bias stage having fifth and sixth inputs and an amplifier stage having seventh and eight inputs, said fifth and sixth inputs of said pre-bias stage coupled to receive signals from said third and fourth outputs and said seventh and eighth inputs coupled to receive signals from said first and second outputs.

8. An amplifier for a semiconductor circuit comprising:

first and second inputs;

first and second outputs;

first and second circuit paths each coupling a source of operating voltage to a reference voltage;

wherein said first circuit path is coupled to said first input and said first output, said first circuit path including a first transistor and a second transistor, said first transistor having its source-drain path coupled between said first input and said first output, and said second transistor having its source-drain path coupled between said first input and ground and its control electrode coupled to said first output to provide negative feedback; and wherein said second circuit path is coupled to said second input and said second output, said second circuit path including a third transistor and a fourth transistor, said third transistor having its source-drain-path coupled between said second input and said second output, and said fourth transistor having its source-drain path coupled between said second input and ground and its control electrode coupled to said second output to provide negative feedback, wherein said first and third transistors are sized so that a voltage differential developed at said inputs, when different input impedances are coupled to said first and second inputs, is small over a range of differential current expected at said first and second inputs.

9. The amplifier according to claim 8, wherein said first and second inputs are coupled, to a pair of data bus lines in a semiconductor memory.

10. An amplifier for a semiconductor circuit comprising:

first and second inputs coupled to a pair of data bus lines in a semiconductor memory;

first and second outputs;

first and second circuit paths each coupling a source of operating voltage to a reference voltage;

wherein said first circuit path is coupled to said first input and said first output, said first circuit path including a first transistor and a second transistor, said first transistor having its source-drain path coupled between said first input and said first output, and said second transistor having its source-drain path coupled between said first input and ground and its control electrode coupled to said first output to provide negative feedback;

wherein said second circuit path is coupled to said second input and said second output, said second circuit path including a third transistor and a fourth transistor, said third transistor having its source-drain path coupled between said second input and said second output, and said fourth transistor having its source-drain path coupled between said second input and ground and its control electrode coupled to said second output to provide negative feedback; and a first stage to generate first and second reference voltages, said first reference voltage being coupled to the control electrode of said first transistor and said second reference voltage being coupled to the control electrode of said third transistor, wherein said first stage includes third and fourth circuit paths each including a transistor, said transistor of said third circuit path being coupled between said source of operating voltage and said second reference voltage and having its control electrode coupled to said second input, and said transistor of said fourth circuit path being coupled between said source of operating and said first reference voltage and having its control electrode coupled to said first input.

11. The amplifier according to claim 10, further including a second stage having third and fourth outputs, said third and fourth outputs adapted to be coupled to a driver circuit to generate differential output currents.

12. The amplifier according to claim 11, further including a driver stage, said driver including a pre-bias stage having fifth and sixth inputs and an amplifier stage having seventh and eight inputs, said fifth and sixth inputs of said pre-bias stage coupled to receive signals from said third and fourth outputs and said seventh and eighth inputs coupled to receive signals from said first and second outputs.

13. The method according to claim 3, further comprising the steps of:

sensing said differential voltages at said outputs to develop a further differential current; and amplifying said further differential current to provide further differential voltages.

* * * * *